US005473266A

United States Patent [19]
Ahanin et al.

[11] Patent Number: 5,473,266
[45] Date of Patent: Dec. 5, 1995

[54] PROGRAMMABLE LOGIC DEVICE HAVING FAST PROGRAMMABLE LOGIC ARRAY BLOCKS AND A CENTRAL GLOBAL INTERCONNECT ARRAY

[75] Inventors: Bahram Ahanin, Cupertino; Janusz K. Balicki, San Jose; Khusrow Kiani, Oakland; William Leong, San Francisco; Ken-Ming Li, Santa Clara; Bezhad Nouban, Fremont, all of Calif.

[73] Assignee: Altera Corporation, San Jose, Calif.

[21] Appl. No.: 324,860

[22] Filed: Oct. 18, 1994

Related U.S. Application Data

[63] Continuation of Ser. No. 49,543, Apr. 19, 1993, abandoned.
[51] Int. Cl.$^6$ ................................................. H03K 19/177
[52] U.S. Cl. ................................................. 326/41; 326/39
[58] Field of Search ..................... 307/465, 465.1; 340/825.83, 825.84, 825.85, 825.86, 825.87; 326/39, 40, 41

[56] References Cited

U.S. PATENT DOCUMENTS

| | | | |
|---|---|---|---|
| 4,617,479 | 10/1986 | Hartmann | 307/465 |
| 4,758,746 | 7/1988 | Birkner et al. | 307/465 |
| 4,771,285 | 9/1988 | Agrawal et al. | 307/465 |
| 4,871,930 | 10/1989 | Wong et al. | |
| 4,963,768 | 10/1990 | Agrawal et al. | 307/465 |
| 5,046,035 | 9/1991 | Jigour et al. | 307/465 |
| 5,136,188 | 8/1992 | Ha et al. | 307/465 |
| 5,224,056 | 6/1993 | Chene et al. | 364/490 |
| 5,225,719 | 7/1993 | Agrawal et al. | 307/465 |
| 5,241,224 | 8/1993 | Pederson et al. | 307/465 |
| 5,258,668 | 11/1993 | Cliff et al. | |
| 5,260,611 | 11/1993 | Cliff et al. | 307/465 |
| 5,268,598 | 12/1993 | Pedersen et al. | |
| 5,302,865 | 4/1994 | Steele et al. | 307/465 |

OTHER PUBLICATIONS

Altera Corporation 1992 Data Book, pp. 1–34.

*Primary Examiner*—Edward P. Westin
*Assistant Examiner*—Benjamin D. Driscoll
*Attorney, Agent, or Firm*—Townsend and Townsend and Crew

[57] ABSTRACT

A programmable logic device has a number of dedicated global control input lines which interface directly with individual building blocks known as logic array blocks. These lines can be used for clocks, presets, clears, or output-enables. Other logic signal lines from the centrally located global interconnect array are selected through an array of multiplexers and then interface with the logic array block. A configuration array of multiplexers in the logic array block selects from among these inputs, generating local control input signals, the final functions of which are decided by further multiplexing at the macrocell level within the logic array block.

12 Claims, 6 Drawing Sheets

PROGRAMMABLE LOGIC DEVICE HAVING FAST PROGRAMMABLE LOGIC ARRAY BLOCKS AND A CENTRAL GLOBAL INTERCONNECT ARRAY

This is a continuation of application Ser. No. 08/049,543, filed Apr. 19, 1993, now abandoned.

BACKGROUND OF THE INVENTION

This invention relates to a programmable logic device architecture which integrates fast logic array blocks into a fast central routing scheme. The invention also combines the low cost and speed of dedicated global control input signals with the programming flexibility of control input signals generated locally at each logic array block.

In the past, when a programmable logic device (PLD) architecture employed fast building blocks, significant routing delays were encountered. Shorter and more uniform delays could be achieved, but the price was the use of slower building blocks.

PLDs have also employed logic array block (LAB) architectures which use one of two schemes for providing control input signals (i.e., clocks, presets, clears, output enables) to the individual logic modules or macrocells of which each LAB is comprised. One scheme uses control input signals which are generated locally at each LAB through the use of multiplexing schemes, product-terms, or other combinatorial logic devices. The other uses dedicated global control input signal lines which are routed directly to each macrocell within a LAB.

Generating control input signals locally at the LAB level provides the user with a great deal of programming flexibility. However, such schemes can be costly, slow, and often result in inefficient use of die area due to the inevitable redundancies in device resources. Global dedication of macrocell control input signals, on the other hand, is inexpensive, minimizes redundancies, and exhibits faster clock-to-output delay times than locally generated clock signals. The disadvantage of dedicated global lines is the loss of programming flexibility.

Traditionally, LAB architectures have employed a plurality of logic modules, also known as macrocells, each of which can be programmed to perform complex, multi-variable logic functions. Macrocells have been implemented using programmable look-up tables or product terms. A macrocell employing look-up tables offers advantages in speed, density, programming flexibility, and manufacturing ease. Such macrocells can be programmed to implement specific logic functions by programming the static random access memory (SRAM) architecture bits of its programmable look-up table. A macrocell can be designed with as many logic inputs as required by the logic operations. Complex logic operations tend to require a high number of input variables. Thus, increasing the fan-in of a macrocell enhances its logic capability.

However, a linear increase in the fan-in of a look-up table results in a geometric increase in the number of programmable architecture bits required to implement the look-up table. For example, a 4-input programmable look-up table requires 16 ($2^4$) programmable architecture bits to implement any 4-variable logic function. An 8-input programmable look-up table requires 256 ($2^8$) programmable architecture bits to implement any 8-variable logic function.

From the manufacturing perspective, a greater number of programmable architecture bits per macrocell means higher circuit density and lower chip yield. In practical terms, this circuit density constraint places an upper limit on the number of programmable architecture bits and consequently the look-up table fan-in. Thus, while designers have always searched for ways to increase the logic capability of PLDs, the challenge has been to balance the macrocell fan-in against this circuit density constraint.

One method of increasing the logic capability of PLDs while keeping circuit density within acceptable levels involves cascading macrocells. Cascading macrocells facilitates logic operations which require a higher fan-in than is available at any one macrocell. For example, two 4-input macrocells can be cascaded to handle certain logic operations involving eight input variables.

It is recognized, however, that cascading macrocells results in inefficient use of circuitry in a PLD. For example, each macrocell contains, in addition to the look-up table, additional circuitry to control functions such as output, carry-chain, etc. When a macrocell is cascaded, that entire macrocell becomes unavailable for other uses within the PLD even though only the look-up table portion is used. Thus, in a PLD of limited physical size having a finite number of macrocells, a high incidence of cascading is undesirable.

From the foregoing, it can be appreciated that there is a need for a PLD architecture which employs fast building blocks without the routing delays usually experienced in such architectures. There is also a need for an architecture which can be adapted to employ dedicated global control input signals as well as generate local control input signals at the LAB and macrocell levels.

It can also be appreciated from the foregoing that there exists a need for a macrocell design based on programmable look-up tables which can more advantageously increase macrocell fan-in without suffering the geometric increase in the number of programmable architecture bits. Such a high fan-in macrocell could reduce the incidence of cascading for complex logic operations while keeping circuit density within manageable levels.

SUMMARY OF THE INVENTION

In accordance with the invention, a programmable logic device (PLD) architecture is described which employs a centrally located array of logic signal conductors, referred to herein as the Global Interconnect Array (GIA), in combination with a new, fast logic array block (LAB) architecture. A bus of dedicated global control input signals is also centrally located on the PLD, but is distinct from the GIA. These global control input signals may be used for clocks, presets, clears, or output-enables. The invention also employs a programmable memory means embedded in the programmable logic device beneath the GIA. The memory stores the pattern which controls the programmable architecture elements of the PLD.

A plurality of programmable LABs are disposed on both sides of the GIA and the global control input signal bus. The GIA interfaces with each of the LABs through an array of multiplexers. The number and size of multiplexers at each interface is determined by the number of signal conductors in the GIA. In the preferred embodiment, at least two opportunities are provided for each GIA line to connect to a particular LAB. Each LAB also has a programmable configuration array, the purpose of which is to connect any of the global control input signal conductors or GIA lines to local control input signal conductors within the LAB.

The LABs employ an improved macrocell design which uses a plurality of programmable look-up tables to increase macrocell fan-ins while keeping circuit density within manageable levels. The outputs of the plurality of programmable look-up tables are logically combined to produce a macrocell logic result. In one embodiment, this logical combination is performed by an AND gate. In another embodiment, a programmable look-up table produces the logical combination. The macrocell logic result of one macrocell can be allocated to another macrocell to increase logic capability. Additional logic is provided to couple the macrocell logic result to external circuitry.

According to one embodiment, a macrocell for use in a programmable logic device employs a plurality of programmable look-up tables, each of which has a predetermined number of inputs and one output, for producing a plurality of table outputs. Logic circuitry of the macrocell operates on these table outputs to produce a macrocell logic result. Output control circuitry, which is responsive to control signals external to the macrocell, is provided to facilitate transmitting the macrocell logic result.

A further understanding of the nature and advantages of the present invention may be realized by reference to the remaining portions of the specification and the drawings.

DESCRIPTION OF THE SPECIFIC EMBODIMENTS

Figure 1:
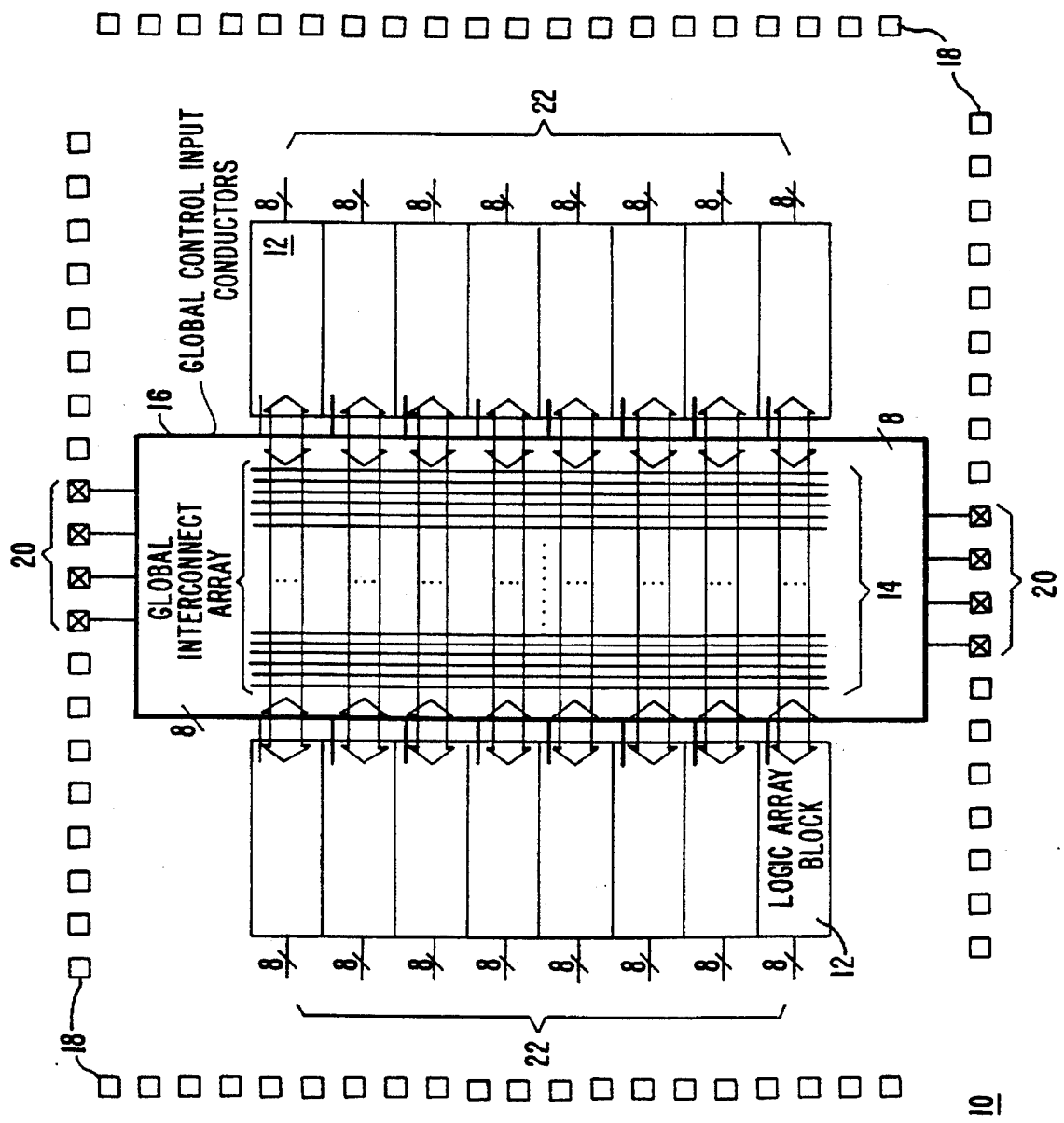
FIG. 1 is a block diagram of the preferred embodiment of the PLD architecture.
Figure 2:
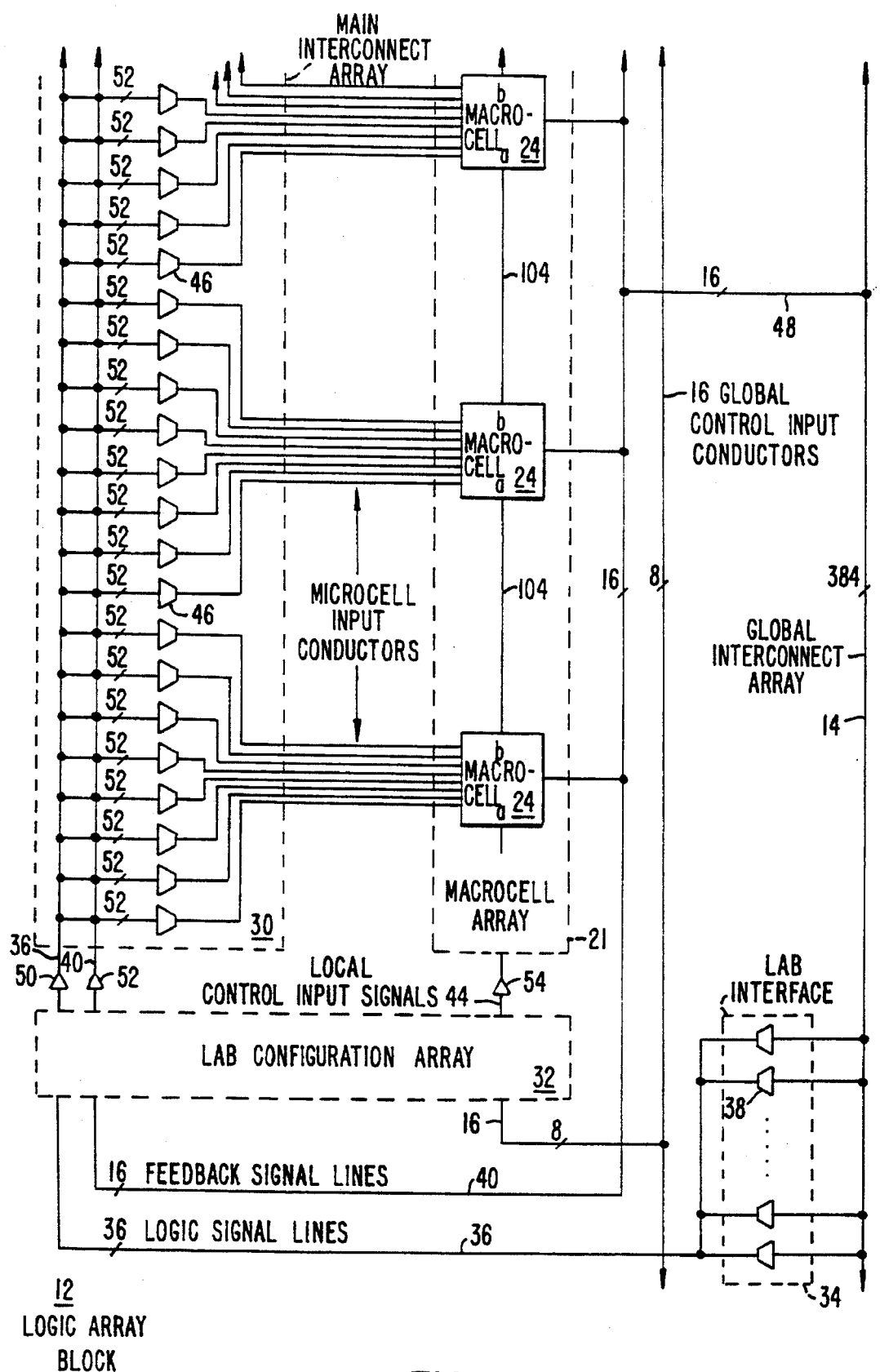
FIG. 2 is a block diagram of the preferred embodiment of the LAB architecture.

FIG. 1 is a block diagram of the preferred embodiment of the PLD architecture. The PLD 10 employs a centrally located Global Interconnect Array (GIA) 14 to interconnect a plurality of fast Logic Array Blocks (LABs) 12. The GIA 14 comprises an array of 384 signal conductors which interfaces with each of the logic array blocks (LABs) 12 through an array of thirty-six 24:1 multiplexers (a portion of which is shown in FIG. 2). This allows each of the 384 signal lines in the GIA 14 at least two opportunities to connect with a particular LAB 12. Of the 384 signal lines in the GIA 14, 128 are from I/O pins 18. Each of the 16 LABs 12 comprises 16 macrocells, the outputs of which directly feed the GIA 14, accounting for the remaining 256 signal lines.

The PLD 10 also employs a bus of eight centrally located dedicated global control input signal lines 16 which interface directly with a configuration array in each LAB 12 (shown in FIG. 2). These lines, which are separate from the GIA 14, have dedicated input pins 20, and can be used for clocks, presets, clears, or output-enables. The logic signal lines from the GIA 14 also interface with the configuration arrays within each LAB 12, but only after they are selected by the aforementioned array of multiplexers. Each LAB 12 sends half of its sixteen macrocell outputs to I/O pins 18 via output signal lines 22. An electrically-erasable programmable read-only-memory (EEPROM) (not shown) is embedded in the programmable logic device beneath the GIA 14, the EEPROM storing the pattern which controls the programmable architecture elements of the PLD 10.

FIG. 2 is a block diagram of the preferred embodiment of the LAB architecture and interface which is employed as part of the present invention. A LAB 12 includes an array 21 of macrocells 24, a main interconnect array 30, a LAB configuration array 32, and a LAB Interface 34.

The LAB configuration array 32 receives thirty-six logic signal lines 36 from the LAB Interface 34. The logic signal lines 36 are selected from the GIA 14 through an array of thirty-six 24:1 multiplexers 38 which constitutes the LAB/GIA Interface 34. The configuration array 32 also receives sixteen feedback signal lines 40 from the outputs of the macrocells 24, and eight global control input signal lines 16 from the PLD global control input signal bus. The LAB configuration array 32 uses its inputs to generate eight local control input signals 44, the final functions of which are decided by further multiplexing at each individual macrocell 24 within the LAB 12.

The thirty-six logic signal lines 36 and the sixteen feedback signal lines 40 are passed through the LAB configuration array 32 and enter the main interconnect array 30 where they are used as inputs to 128 52:1 multiplexers 46. The outputs of multiplexers 46 are then used as inputs to the LAB's sixteen macrocells 24, wherein the logical manipulation of the signals takes place. The outputs of the macrocells 24 are connected to a bus of sixteen feedback signal lines 40, but are also sent to the GIA 14 via lines 48. The feedback signal lines 40, the logic signal lines 36, and the local control input signal lines 44 are all driven by buffer/drivers 50, 52, and 54 respectively.

Each of the macrocells 24 in the LAB 12 employs at least one look-up table to perform multi-variable logic functions on the input signals to the macrocell 24. In the preferred embodiment, the function of a particular look-up table is determined by static random-access memory (SRAM) bits embedded in the LAB 12 architecture. Of course, other type memory cells or information storage media also could be used. Different embodiments of the LAB may employ a specific number of look-up tables in each macrocell, or incorporate an expander array of non-dedicated look-up tables which can be shared among the macrocells (shown in FIG. 3), or even incorporate AND-OR arrays in place of the look-up tables. Additionally, the macrocells 24 of LAB 12 may be connected in a cascade through the use of allocation conductors 104 connected between the allocation input 24a and allocation output 24b of each macrocell 24.

Figure 3:
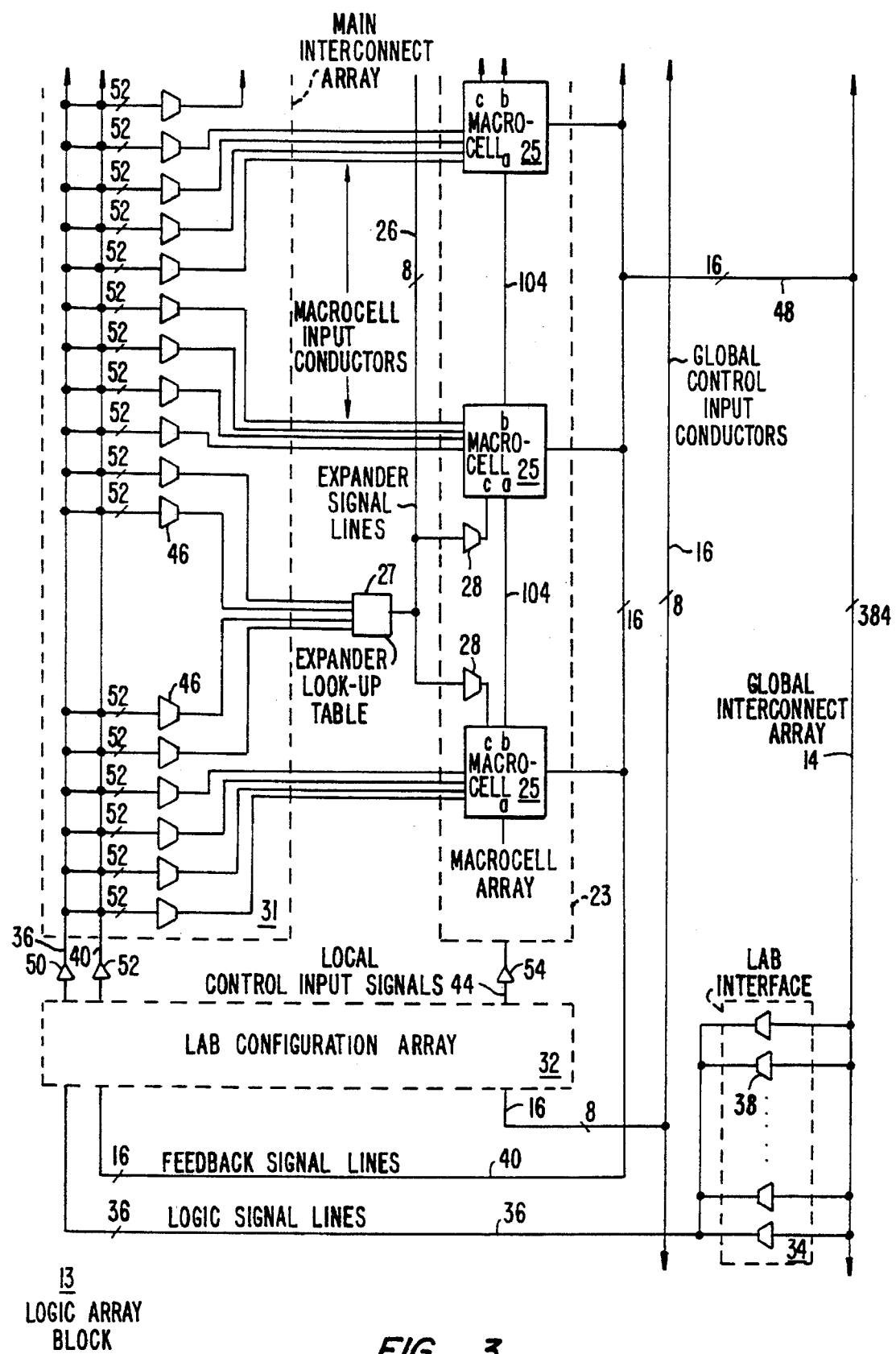
FIG. 3 is a block diagram of an alternate embodiment of the LAB architecture.

FIG. 3 shows an additional embodiment of a LAB 13 architecture which can be incorporated into the present invention. Many similarities exist between the architectures depicted in FIGS. 2 and 3. However, unlike FIG. 2, the macrocells 25 of FIG. 3 (in macrocell array 23) employ only one dedicated look-up table, having access by means of eight expander signal lines 26 to an array of eight expander look-up tables 27 which are external to the macrocells 25 and which are shared among them. If a particular macrocell 25 utilizes one of the expander look-up tables 27, the output of that table is connected to the expander input 25c of the macrocell 25 by means of an external multiplexing scheme employing eight 8:1 multiplexers 28. As a consequence of this scheme, the main interconnect array 31 requires only ninety-six 52:1 multiplexers 46 in this embodiment.

The control lines of all the aforementioned multiplexers 28, 38, and 46 are controlled by data stored in SRAM cells embedded in the LAB architecture. The contents of these SRAM cells control the LAB architecture, receiving their data when power is supplied to the PLD. Although other approaches are possible, preferably the data is downloaded from an electrically-erasable programmable read-only-memory (EEPROM) which is embedded in the PLD integrated circuit 10 beneath the central GIA bus 14 (see FIG. 1). After the architecture is thus initialized, the device's architecture sense amps are turned off. This feature, combined with the comparatively low quiescent current of multiplexers and look-up tables, results in a low device power dissipation.

Figure 4:
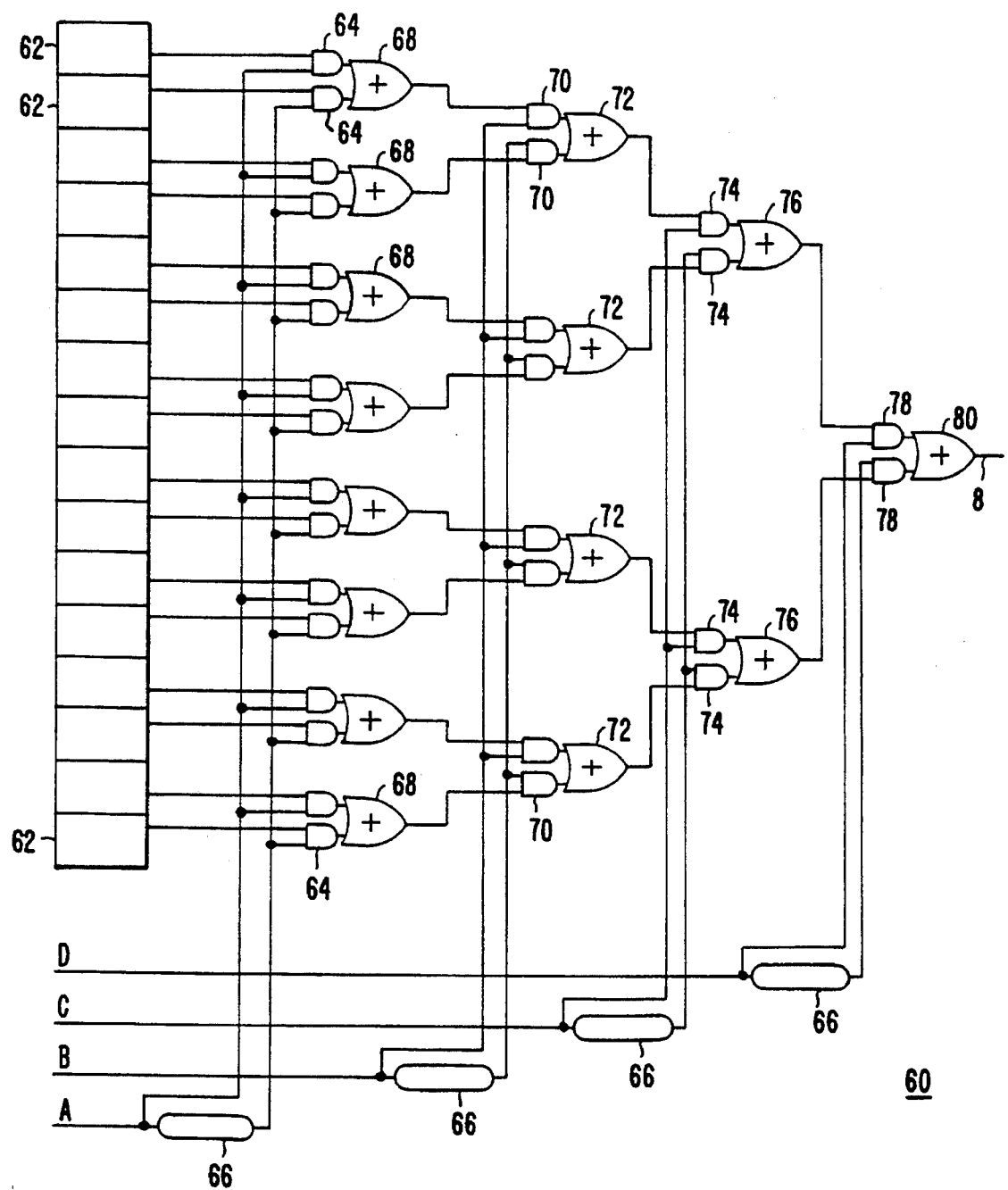
FIG. 4 shows a representative programmable 4-input look-up table.

FIG. 4 shows a representative programmable 4-input look-up table 60. Since there are 16 ($2^4$) possible combinations of inputs for a 4-input look-up table, 16 programmable architecture bits, as represented by SRAM cells 62, are required to fully implement any possible logic four-variable function. The output signal of each of these SRAM cells 62 is applied to a respective one of sixteen 2-input AND gates 64. Alternate ones of AND gates 64 are respectively controlled by the true and complement of a first data input A, the complement of data input A being produced by an inverter 66. The outputs of each adjacent pairs of gates 64 are then combined by a respective one of eight 2-input OR gates 68, which output is then applied to a respective one of eight 2-input AND gates 70. Alternate ones of AND gates 70 are respectively controlled by the true and complement of a second data input B, the complement of data input B being produced by an inverter 66. The outputs of each adjacent pairs of AND gates 70 are then combined by a respective one of four 2-input OR gates 72, which output is then applied to a respective one of four 2-input AND gates 74. Alternate ones of AND gates 74 are respectively controlled by the true and complement of a third data input C, the complement of data input C being produced by an inverter 66. The outputs of each adjacent pairs of AND gates 74 are combined by a respective one of two 2-input OR gates 76, which output is then applied to a respective one of two 2-input AND gates 78. One of AND gates 78 is controlled by the true of a fourth data input D, while the other AND gate 78 is controlled by the complement of that data input D, the complement of data input D being produced by an inverter 66. The outputs of AND gates 78 are combined by an OR gate 80 to produce the data output on a conductor 82. It will be apparent from the foregoing that any logical combination of data inputs A-D can produce an appropriately programmed output from SRAM cells 62.

Figure 5:
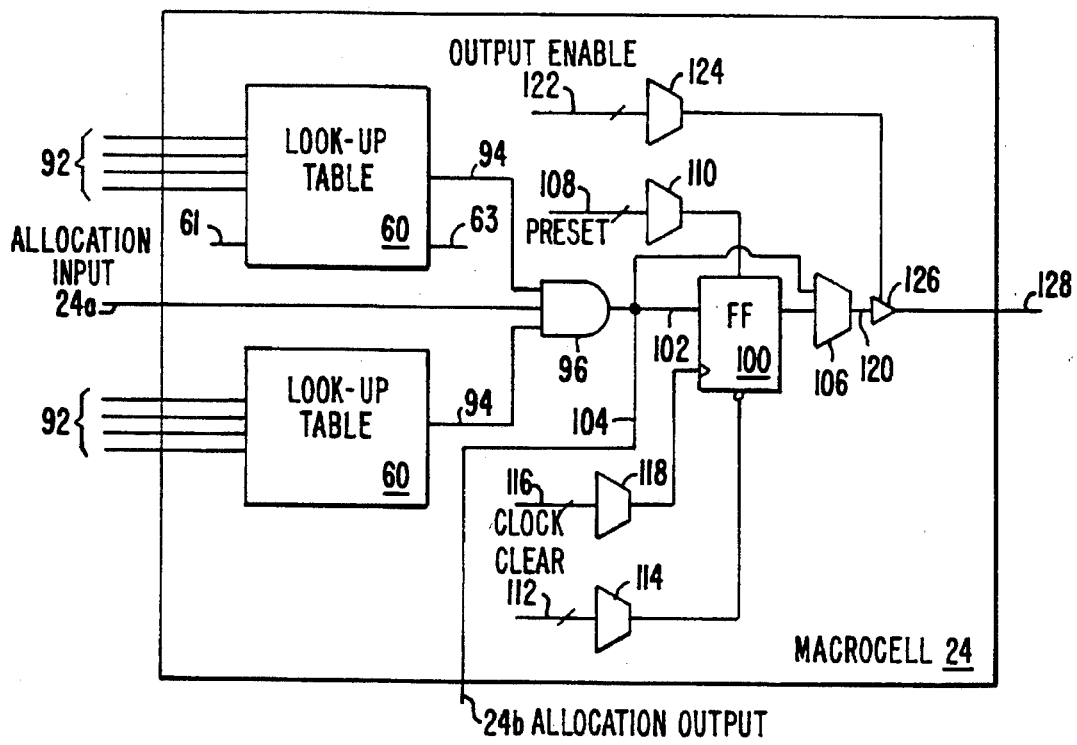
FIG. 5 shows a macrocell design using two programmable 4-input look-up tables.

FIG. 5 shows a macrocell design as employed in the embodiment of FIG. 2. The macrocell 24 uses two programmable 4-input look-up tables 60 to achieve a macrocell fan-in of eight. Each programmable 4-input look-up table 60 as shown has four input lines 92, and each table 60 is capable of logic operations involving up to four input variables. As previously discussed, each 4-input look-up table 60 requires 16 programmable architecture bits for full implementation. The output of each look-up table 60 is connected through a conductor 94 to a 3-input AND gate 96. The AND gate 96 logically combines the outputs of these two look-up tables 60, enabling the macrocell 24 to perform certain logic operations involving up to eight variables. A third input 24a to the 3-input AND gate 96 receives its allocation signal, if any, from an adjacent macrocell. (If the macrocell functions independently, i.e., if macrocell 24 does not require an allocation input from another macrocell, input 24a floats to logic 1). The output of the 3-input AND gate 96 is connected to the D input of a programmable flip-flop 100 via a conductor 102, and is allocated to an adjacent macrocell via a conductor 104. Allocation permits a macrocell 24 to allocate some or all of its look-up tables 60 to another macrocell 24, thereby increasing the PLD's logic capability. The output of the 3-input AND gate 96 can also bypass the programmable flip-flop 100 via a programmable switch 106. A configuration signal Preset 108 is applied via a programmable switch 110 to the PRESET input of the programmable flip-flop 100 while a configuration signal Clear 112 is applied via a programmable switch 114 to the CLR input. A configuration signal Clock 116 is applied via a programmable switch 118 to the CLK input of the programmable flip-flop 100 to synchronize the macrocell logic result 120. A configuration signal Output Enable 122 controls via a programmable switch 124 a tri-state switch 126 to facilitate coupling the macrocell logic result 120 to external circuitry via a lead 128. It is apparent from the foregoing that the macrocell 24, which is capable of certain logic operations involving up to eight input variables, requires only 32 programmable architecture bits for its two programmable look-up tables 60. A design using one programmable look-up table, by contrast, would need 256 programmable architecture bits to handle logic operations involving eight input variables. In addition to the allocation function of the macrocell 24, each look-up table 60 has a cascade input 61 and a cascade output 63 by which the look-up table 60 may be cascaded with other look-up tables 60 in the LAB 12.

Figure 6:
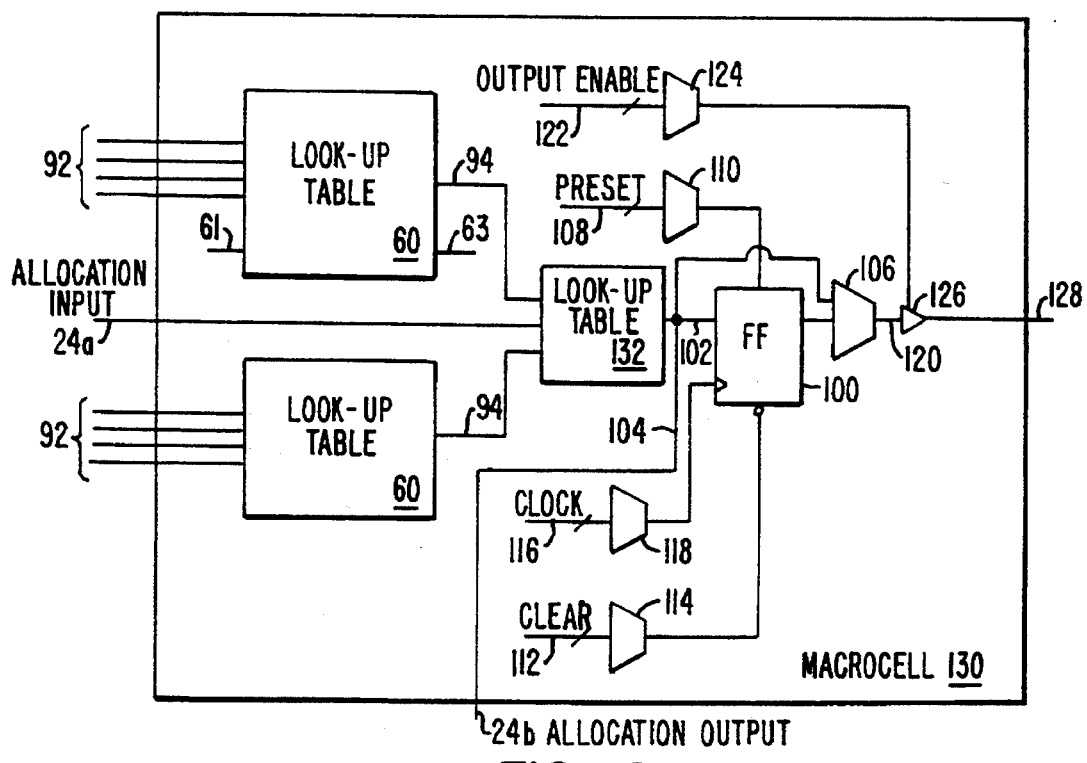
FIG. 6 shows a macrocell design using two programmable 4-input look-up tables in conjunction with a programmable 3-input look-up table.

FIG. 6 shows, in another embodiment, a macrocell 130 using two programmable 4-input look-up tables 60 in conjunction with a programmable 3-input look-up table 132. The macrocell 130 of FIG. 6 is identical to the macrocell of FIG. 5 except that in FIG. 6, the 3-input AND gate 96 of FIG. 5 has been replaced by the programmable 3-input look-up table 132. The use of the programmable 3-input look-up table 132 in place of the 3-input AND gate 96 of FIG. 5 improves the macrocell programming flexibility since the programmable 3-input look-up table 132 of FIG. 6 can be programmed to perform any desired logic combination involving the logical results of the two programmable 4-input look-up tables 60 and the allocation input 24a.

To reduce circuit density even further, the programmable 3-input look-up table 132 of FIG. 6 may be customized, through a reduction in the number of programmable architecture bits, to implement a smaller range of logic functions. For example, customizing the 3-input look-up table 132 of FIG. 6 to provide only for the AND, OR, and XOR logic functions reduces the number of required programmable architecture bits from eight to two. The customized programmable look-up table is more fully described in commonly assigned, co-pending patent application Ser. No. 08/017,096, filed Feb. 12, 1993, (Attorney Docket No. 15114-365).

Figure 7:
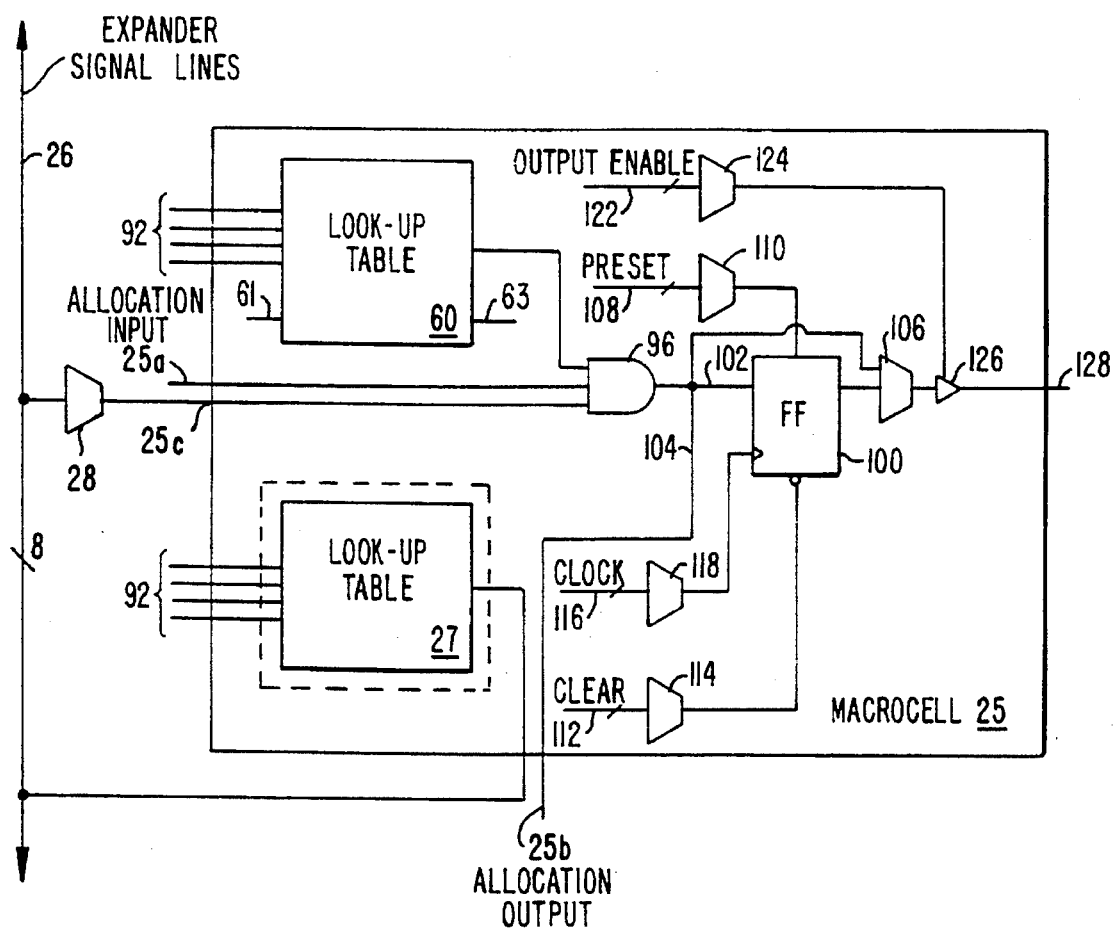
FIG. 7 shows a macrocell design to be used in the embodiment shown in FIG. 3.

FIG. 7 shows the design for a macrocell 25 which is part of the embodiment shown in FIG. 3. As previously discussed, each macrocell 25 employs only one dedicated look-up table 60, having access by means of eight expander signal lines 26 to an array of eight expander look-up tables 27 which are external to the macrocells 25 and which are shared among them. If a particular macrocell 25 utilizes one of the expander look-up tables 27, the output of that table is connected to the expander input 25c of the macrocell 25 by means of an external multiplexing scheme employing eight 8:1 multiplexers 28. The allocation input and output for the macrocell 25 are 25a and 25b respectively.

While the invention has been particularly shown and described with reference to specific embodiments thereof, it will be understood by those skilled in the art that the foregoing and other changes in the form and details may be made therein without departing from the spirit or scope of the invention. Consequently, the scope of the invention should be determined solely with respect to the following claims.

What is claimed is:

1. A programmable logic device comprising:

a plurality of first logic signal conductors disposed in an array located primarily in a central region on the programmable logic device;

a plurality of global control input conductors disposed in the central region, and being distinct from the first logic signal conductors; and a plurality of programmable logic array blocks disposed on both sides of the central region, each programmable logic array block comprising:

a plurality of second logic signal conductors, a first array of programmable switches for connecting the first logic signal conductors to the second logic signal conductors, wherein the first array of programmable switches provides at least two ways in which each of the first logic signal, conductors may be connected to one of the plurality second logic signal conductors, a plurality of local control input conductors for transmitting control signals to logic devices in the programmable logic array block, and a programmable configuration array for programmably connecting any of the second logic signal conductors and the global control input conductors to the local control input conductors.

2. A programmable logic device as described in claim 1 further comprising a programmable memory means embedded in the programmable logic device beneath the first logic signal conductors, the programmable memory means for programmably connecting the conductors in the programmable logic device.

3. A programmable logic device as described in claim 2 wherein the programmable memory means comprises an electrically-erasable programmable read-only memory.

4. A programmable logic device as described in claim 1 wherein each programmable logic array block further comprises:

a plurality of local feedback conductors;

a second array of switches for connecting any of the global control input conductors, the second logic signal conductors, and the local feedback conductors to any of the local control input conductors;

a plurality of macrocell input conductors;

a third array of switches for connecting any of the second logic signal conductors and the local feedback conductors to any of the macrocell input conductors;

a plurality of programmable macrocells capable of performing multi-variable logic functions, the programmable macrocells comprising:

a plurality of logic signal input terminals connected to the macrocell input conductors, a plurality of control signal input terminals connected to the local control input conductors, an allocation input terminal, an allocation output terminal, and a first macrocell output terminal connected to one of the local feedback conductors and one of the first logic signal conductors;

a plurality of allocation signal conductors, each of the allocation signal conductors being connected between the allocation output terminal of one of the programmable macrocells and the allocation input terminal of an adjacent programmable macrocell; and a plurality of buffer/driver circuits in series with the local control input conductors, the local feedback conductors, and the second logic signal conductors.

5. A programmable logic device as described in claim 4 wherein the first, second, and third arrays of switches comprise multiplexers, the multiplexers being controlled by static random-access memory cells embedded in the programmable logic array block.

6. A programmable logic device as described in claim 1 wherein each programmable logic array block further comprises:

a first array of switches for connecting the first logic signal conductors to the second logic signal conductors;

a plurality of local feedback conductors;

a second array of switches for connecting any of the global control input conductors, the second logic signal conductors, and the local feedback conductors to any of the local control input conductors;

a plurality of macrocell input conductors;

a third array of switches for connecting any of the second logic signal conductors and the local feedback conductors to any of the macrocell input conductors;

a plurality of first expander conductors;

a plurality of second expander conductors;

a fourth array of switches for connecting any of the first expander conductors to any of the second expander conductors;

a plurality of programmable macrocells capable of performing multi-variable logic functions, each of the programmable macrocells comprising:

a plurality of logic signal input terminals connected to selected macrocell input conductors, a macrocell expander input terminal connected to one of the second expander conductors, a plurality of control signal input terminals connected to the local control input conductors, an allocation input terminal, an allocation output terminal, and a first macrocell output terminal connected to one of the local feedback conductors and one of the first logic signal conductors;

a plurality of combinatorial logic devices, each combinatorial logic device having a plurality of expander inputs and an expander output, the expander inputs being connected to selected macrocell input conductors, and the expander output being connected to one of the first expander conductors;

a plurality of allocation signal conductors, each of the allocation signal conductors being connected between the allocation output terminal of one of the programmable macrocells and the allocation input terminal of an adjacent programmable macrocell; and a plurality of buffer/drivers in series with the first expander conductors, the local control input conductors, the local feedback conductors, and the second logic signal conductors.

7. A programmable logic device as described in claim 6 wherein the first, second, third, and fourth arrays of switches comprise multiplexers, the multiplexers being controlled by static random-access memory cells embedded in the programmable logic array block.

8. A programmable logic device as described in claim 6 wherein the combinatorial logic devices comprise programmable look-up tables.

9. A programmable logic device comprising:
   a plurality of first logic signal conductors disposed in an array located primarily in a central region on the programmable logic device;
   a plurality of global control input conductors disposed in the central region, and being distinct from the first logic signal conductors;
   a programmable memory means embedded in the programmable logic device beneath the first logic signal conductors; and
   a plurality of programmable logic array blocks disposed on both sides of the central region, each programmable logic array block comprising:
   a plurality of second logic signal conductors,
   a first array of switches for connecting the first logic signal conductors to the second logic signal conductors, wherein the first array of switches provides at least two ways in which each of the first logic signal conductors may be connected to one of the plurality second logic signal conductors,
   a plurality of local feedback conductors,
   a plurality of local control input conductors,
   a second array of switches for connecting any of the global control input conductors, the second logic signal conductors, and the local feedback conductors to any of the local control input conductors,
   a plurality of macrocell input conductors,
   a third array of switches for connecting any of the second logic signal conductors and the local feedback signal conductors to any of the macrocell input conductors,
   a plurality of programmable macrocells capable of performing multi-variable logic functions, the programmable macrocells comprising:
   a plurality of logic signal input terminals connected to the macrocell input conductors,
   a plurality of control signal input terminals connected to the local control input conductors,
   an allocation input terminal,
   an allocation output terminal, and
   a first macrocell output terminal connected to one of the local feedback conductors and one of the first logic signal conductors,
   a plurality of allocation signal conductors, each of the allocation signal conductors being connected between the allocation output terminal of one of the programmable macrocells and the allocation input terminal of an adjacent programmable macrocell, and
   a plurality of buffer/driver circuits in series with the local control input conductors, the local feedback conductors, and the second logic signal conductors.

10. A programmable logic device as described in claim 9 wherein the first, second, and third arrays of switches comprise multiplexers, the multiplexers being controlled by static random-access memory cells embedded in the programmable logic array block.

11. A programmable logic device as described in claim 9 wherein the programmable memory means comprises an electrically-erasable programmable read-only memory.

12. A programmable logic device comprising:
   a plurality of first logic signal conductors disposed in an array located primarily in a central region on the programmable logic device;
   a plurality of global control input conductors disposed in the central region, and being distinct from the first logic signal conductors;
   an electrically-erasable programmable read-only-memory embedded in the programmable logic device beneath the first logic signal conductors;
   a plurality of programmable logic array blocks disposed on both sides of the central region, each programmable logic array block comprising:
   a plurality of second logic signal conductors,
   a first array of multiplexers for connecting the first logic signal conductors to the second logic signal conductors, wherein the first array of multiplexers provides at least two ways in which each of the first logic signal conductors may be connected to one of the plurality second logic signal conductors,
   a plurality of local feedback conductors,
   a plurality of local control input conductors,
   a second array of multiplexers for connecting any of the global control input conductors, the second logic signal conductors, and the local feedback conductors to any of the local control input conductors,
   a plurality of macrocell input conductors,
   a third array of multiplexers for connecting any of the second logic signal conductors and the local feedback conductors to any of the macrocell input conductors,
   sixteen programmable macrocells capable of performing multi-variable logic functions, the programmable macrocells comprising:
   a plurality of logic signal input terminals connected to the macrocell input conductors,
   a plurality of control signal input terminals connected to the local control input conductors,
   an allocation input terminal,
   an allocation output terminal, and
   a first macrocell output terminal connected to one of the local feedback conductors and one of the first logic signal conductors,
   a plurality of allocation signal conductors, each of the allocation signal conductors being connected between the allocation output terminal of one of the programmable macrocells and the allocation input terminal of an adjacent programmable macrocell, and
   a plurality of buffer/driver circuits in series with the local control input conductors, the local feedback conductors, and the second logic signal conductors; and
   a plurality of static random-access memory cells embedded in the programmable logic device for controlling the first, second, and third arrays of multiplexers.

* * * * *